(12) United States Patent
Brankovic et al.

(10) Patent No.: US 6,539,215 B1
(45) Date of Patent: Mar. 25, 2003

(54) DOWN CONVERTER AND DEMODULATOR USING A THREE PORT JUNCTION

(75) Inventors: Veselin Brankovic, Fellbach (DE); Dragan Krupezevic, Stuttgart (DE); Masayoshi Abe, Kanagawa (JP); Tino Konschak, Stuttgart (DE); Thomas Dölle, Stuttgart (DE)

(73) Assignees: Sony Corporation, Tokyo (JP); Sony International (Europe) GmbH, Berlin (DE)

( * ) Notice: Subject to any disclaimer, the term of this patent is extended or adjusted under 35 U.S.C. 154(b) by 0 days.

(21) Appl. No.: 09/578,755

(22) Filed: May 25, 2000

(30) Foreign Application Priority Data

May 27, 1999 (EP) .............................. 99110296

(51) Int. Cl.[7] .................................. H04B 1/26
(52) U.S. Cl. ............................ 455/323; 455/325
(58) Field of Search ................ 455/146, 225, 455/337, 302, 304, 324, 326, 226.1, 325, 322–323

(56) References Cited

U.S. PATENT DOCUMENTS

| | | | |
|---|---|---|---|
| 3,955,158 A | * 5/1976 | Upadhyayula et al. | 333/29 |
| 5,159,710 A | * 10/1992 | Cusdin | 455/304 |
| 5,878,089 A | * 3/1999 | Dapper et al. | 375/325 |
| 6,240,100 B1 | * 5/2001 | Riordan et al. | 370/442 |
| 6,317,589 B1 | * 11/2001 | Nash | 455/245.2 |

FOREIGN PATENT DOCUMENTS

EP 0 884 836 12/1998

OTHER PUBLICATIONS

Li J Et Al: "A Six–Port Direct Digital Millimeter Wave Receiver" IEEE MTT–S International Microwave Symposium Digest, San Diego, May 23, 1994, pp. 1659–1662, XP000512814.

* cited by examiner

*Primary Examiner*—Thang Cong Le
*Assistant Examiner*—Tuan Tran
(74) *Attorney, Agent, or Firm*—Frommer Lawrence & Haug LLP; William S. Frommer; Gordon Kessler

(57) ABSTRACT

A down converter for RF signals comprises one three port junction (7) having one input port six for modulated digital RF signals and two output ports (8, 9). The output ports (8, 9) are respectively connected to a power sensor (10, 11). The three port junction (7) comprises a power splitter (16) dividing the signal supply to the input terminal (6) of the two branches, processing means (17, 18, 19, 21, 22, 23, 24) for processing one of the branches and a four port junction device (20) for combining the two branches and for generating two output signals to be supplied to the output terminals (8, 9) of the three port junction (7). The processing means can comprise a delay unit (18) or alternatively a frequency divider (21), a plurality of filters (22, 24) and a frequency multiplicator (23).

21 Claims, 18 Drawing Sheets

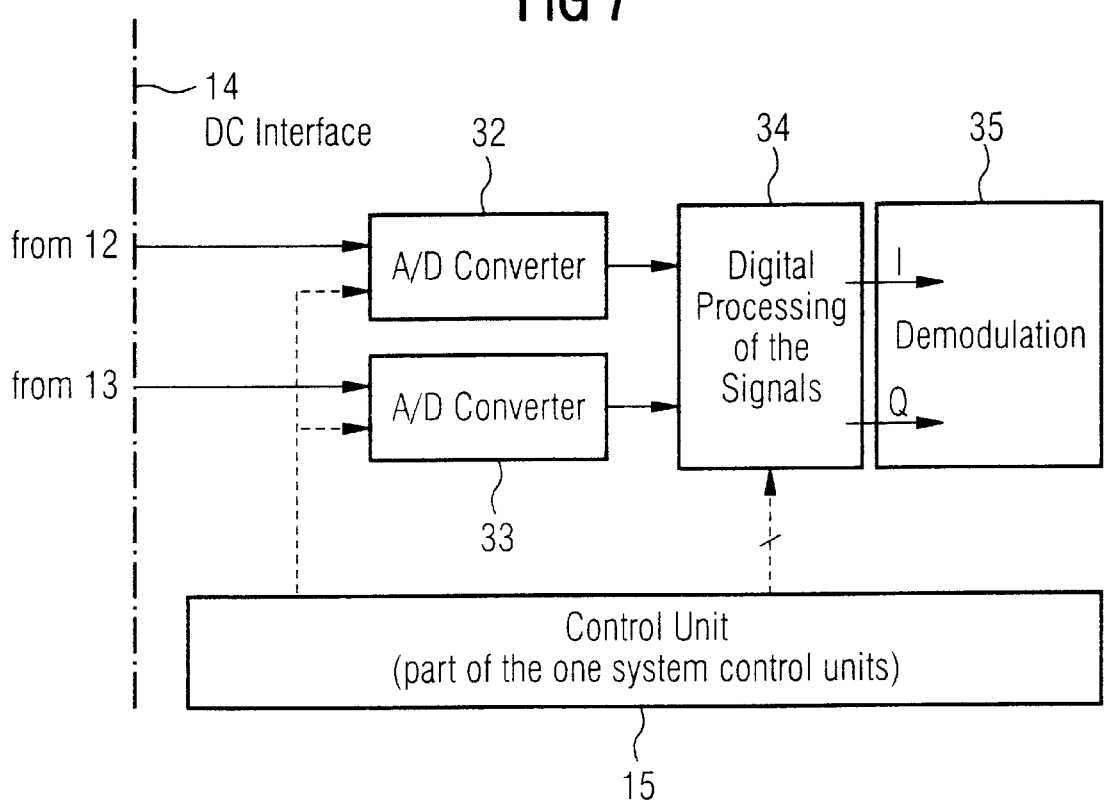

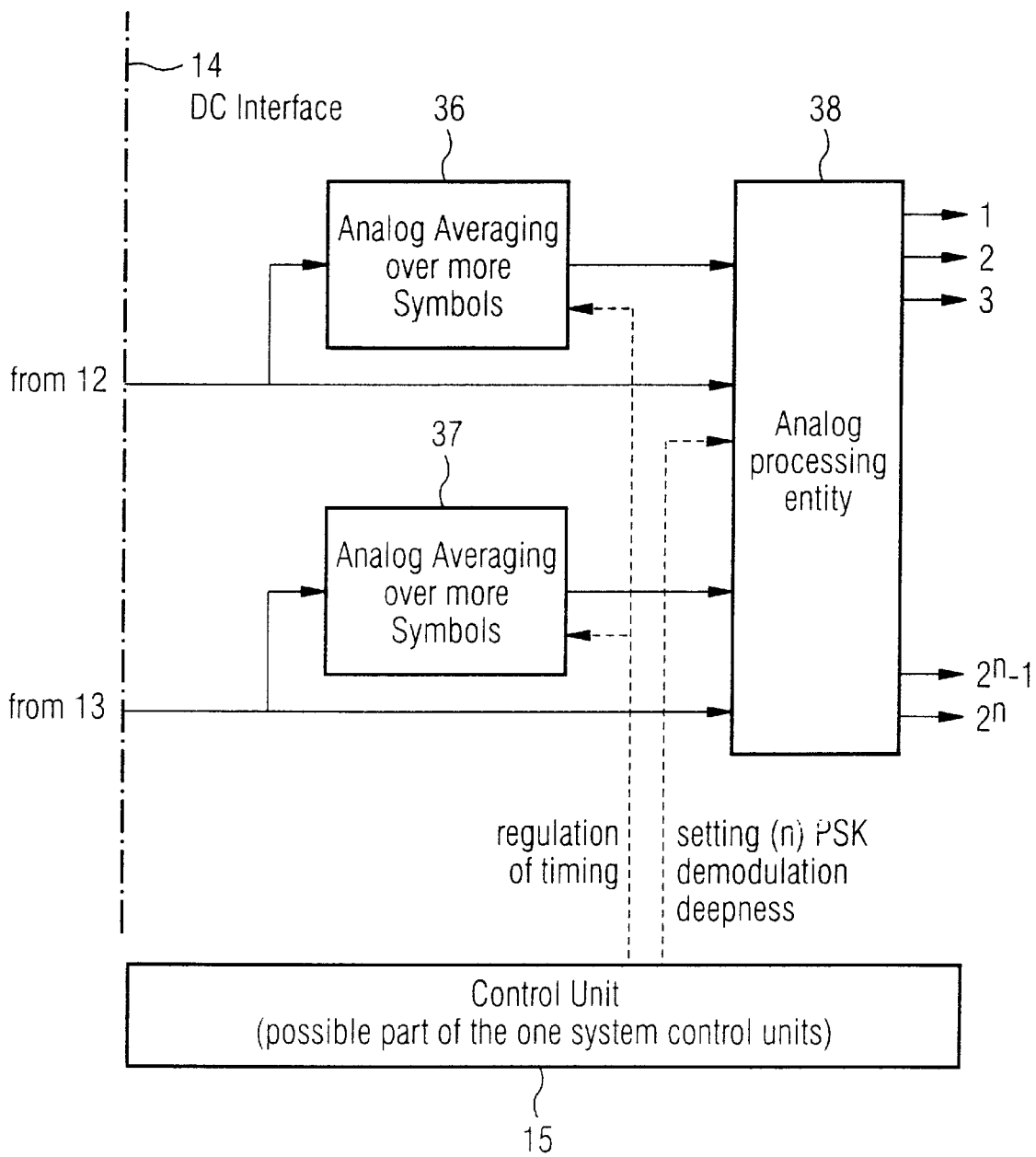

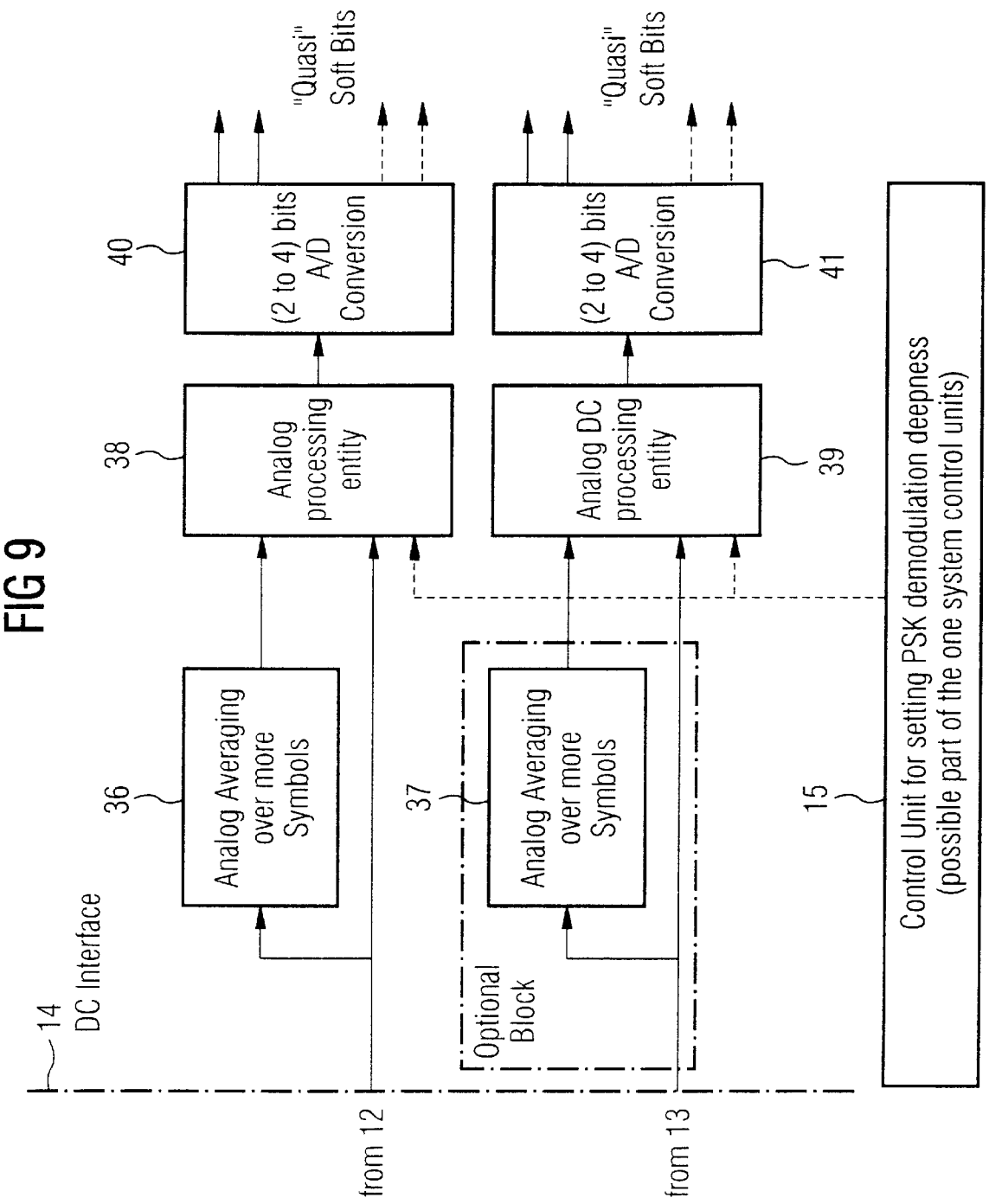

Figure 1:
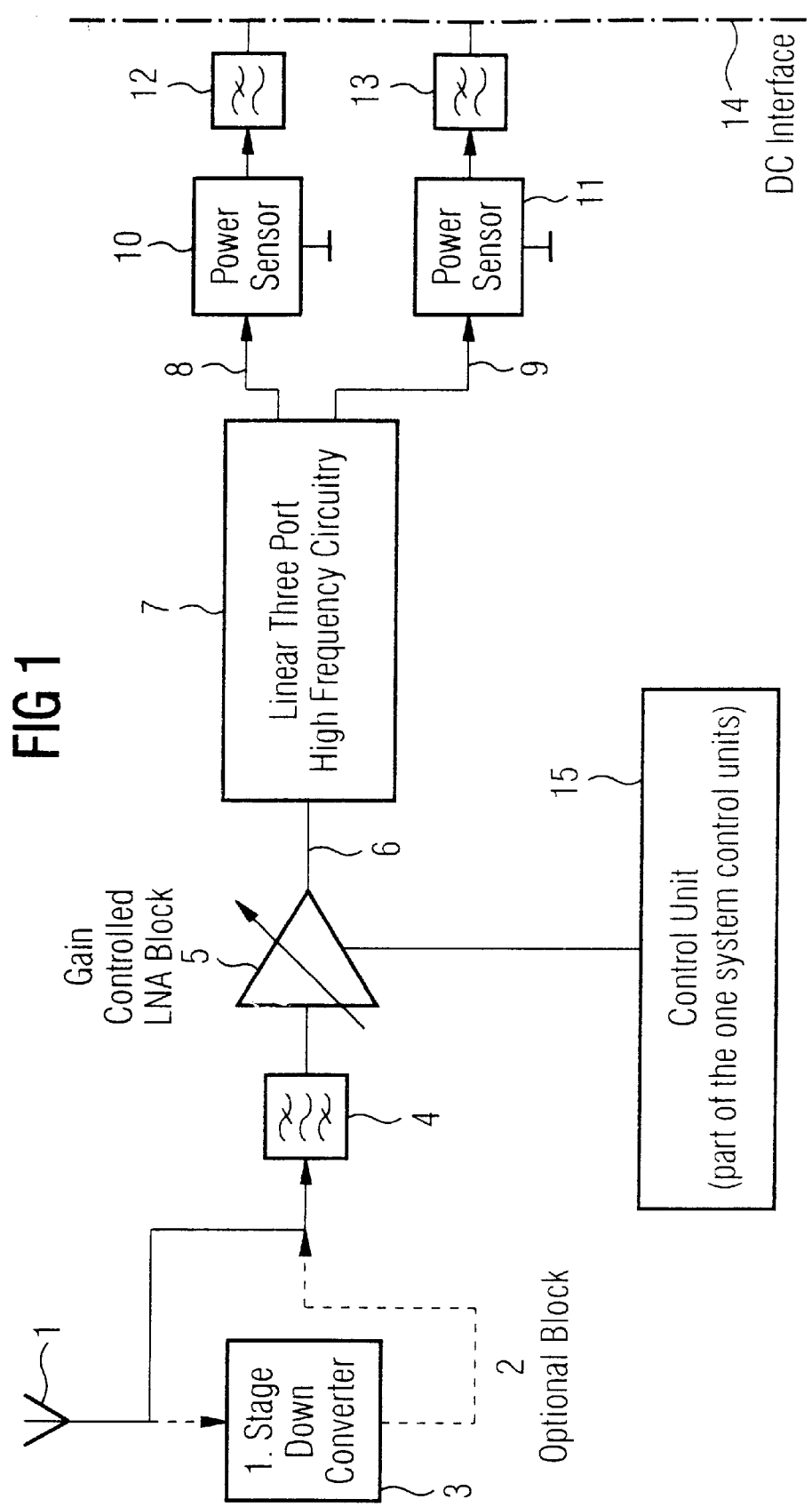

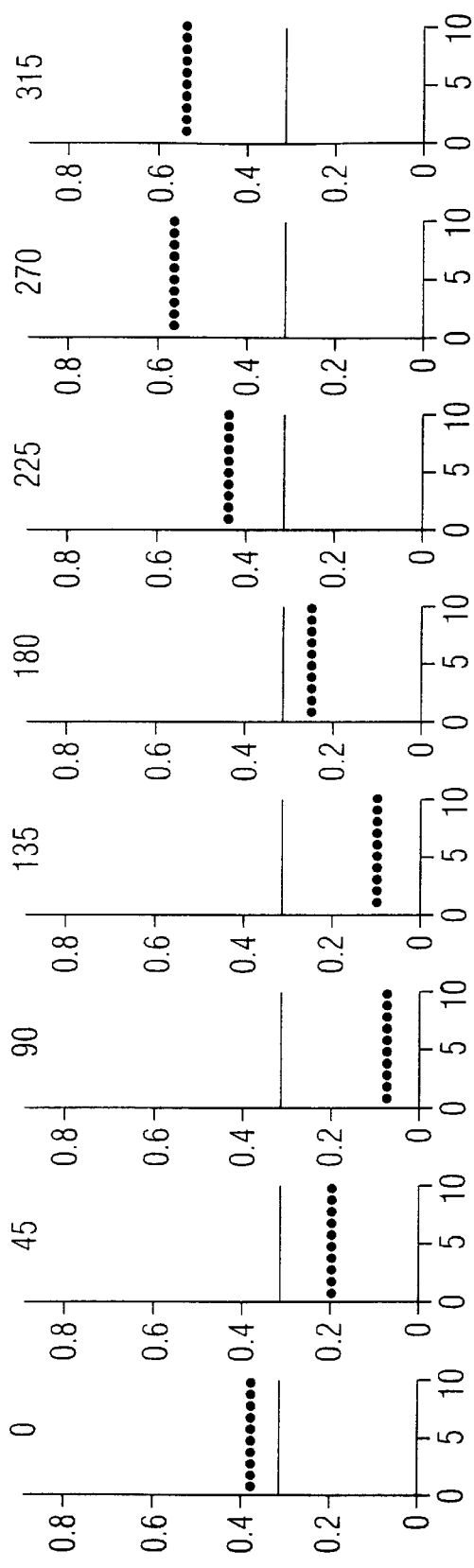
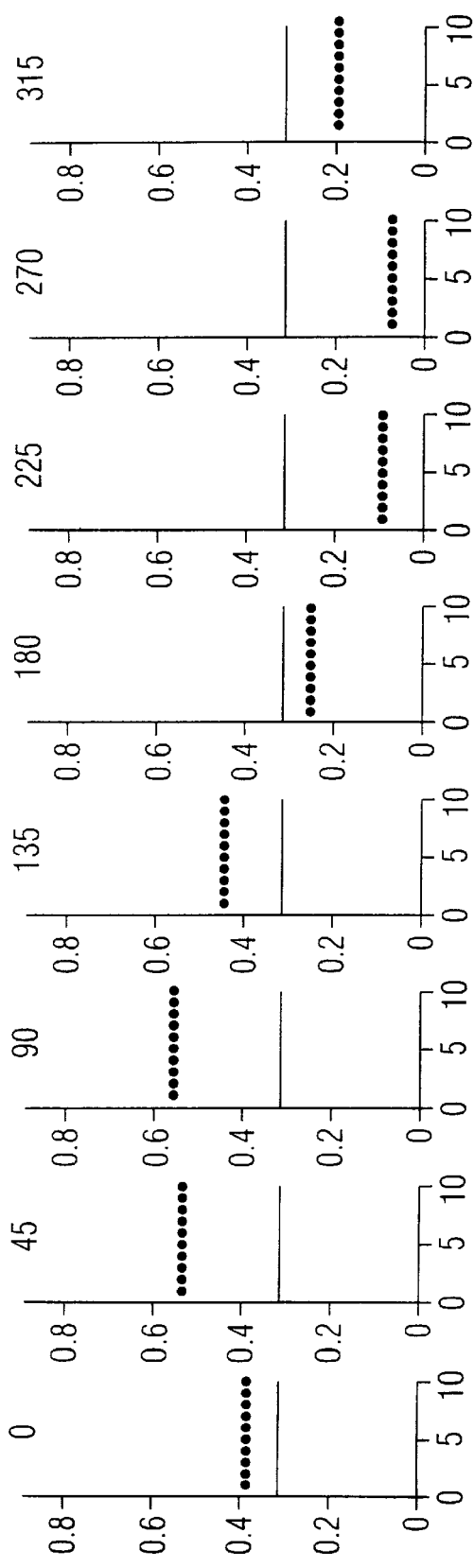
FIG 17

DOWN CONVERTER AND DEMODULATOR USING A THREE PORT JUNCTION

The present invention relates to a down converter for RF signals, a demodulator comprising a down converter, a mobile communications device comprising such a demodulator, a method for down converting RF signals by means of one three port junction as well as to a demodulation method.

The proposed technique is particularly convenient for down converting and demodulating RF signals modulated with a modulation scheme with constant envelope such as f.e. nPSK (Phase Shift Keying).

The so-called six-port technology which has been used up to the last years for complex measurements can also be utilised for designing receivers. Receiver built on the basis of a six-port assembly act in the direct conversion manner allowing therefore a conversion from for example signals in the mm-wave range and microwave range directly to a base band frequency. The main feature of the six-port receiver thereby is the detection of the vector ratio between two incoming vector signals by means of a power sensing at different positions within the RF circuitry of the six-port topology. A direct six-port receiver is for example described in Ji Li, R. G. Bossisio and Ke Wu: "A six port direct digital millimeter wave receiver", Digest of IEEE MTT Symposium, vol.3, pp 1659≦1662, San Diego, May 1994.

From the WO99/08426 a non-coherent six-port receiver is known. This known receiver comprises a power divider to divide a modulated RF input signal in at least two branches. At least one delay line provides for a delay of the branches relatively to each other by a predetermined delay constant. A calculation circuit calculates at least three power levels based on combinations of the two branches of the input signal relatively delayed to each other. A processing means calculates the phase and the amplitude of a complex signal representing the relation between the two branches of the input signal relatively delayed to each other, on the basis of the said at least three power levels.

It is the object of the present invention to further develop the above-cited non-coherent six-port receiver technology such that the complexity of the necessary circuitry can be reduced.

This object is achieved by means of the features of the independent claims. The depending claims developed further the central idea of the present invention.

The new technology according to the present invention allows the same functionality as a non-coherent six-port receiver topology as it is set forth in the WO99/08426. However, the RF circuitry can be significantly reduced and only two power sensors are necessary. A local oscillator can be omitted. In case of simple modulation techniques like (n) PSK there is furthermore no need for a RF switch.

According to a first aspect of the present invention therefore a down converter for RF signals is provided, wherein the down converter comprises one three port junction device. The three port junction device has one input port and two output ports, wherein the output ports are respectively connected to a power sensor.

The down converter can be a non-coherent down converter without any local oscillator.

The three port junction device can comprise a power splitter dividing the signal supplied to the input terminal into two branches. Furthermore a processing means for processing one of the branches and a four port junction device for combining the two branches and for generating two output signals to be supplied to the output terminals are comprised in the three port junction device.

The processing means can comprise a delay unit.

Alternatively the processing means can comprise a frequency divider, at least one filter means and a frequency multiplier.

The dividing factor of the frequency divider is equal to the multiplying factor of the frequency multiplier.

A switch can be provided in the signal branch processed by the processing means.

According to the present invention furthermore a demodulator comprising a down converter as set forth above is provided. The signal supplied to the input port in this case is a digital modulated signal and the switch is controlled to be opened during a time duration corresponding to one half of the bit duration of the supplied digital modulated signal.

Respectively one A/D converter can be connected directly or indirectly with one of the power sensor.

According to another aspect of the present invention a demodulator comprising a down converter as set forth above is provided. At least one averaging unit is connected directly or indirectly with the output of the power sensor and the output of the averaging units is supplied together with signals corresponding to the input signal of the at least one averaging unit to at least one analog processing unit.

According to the present invention furthermore a mobile communications device comprising a demodulator as set forth above is provided.

According to a still further aspect of the present invention a method for down converting RF signals by means of one three port junction device is provided. A RF signal is supplied to one input port of the three port junction device. Two output signals are generated on the basis of the one input RF signal. The output signals are supplied at two output ports of the three port junction device respectively to a power sensor.

The step of generating two output signals on the basis of the input RF signal can comprise the step of dividing the signal supply to the input terminal to two branches. One of the branches is processed and the two branches are combined, wherein as a result of the combination of the two branches two output signals to be supplied to the output terminals and thus to the power sensors are generated.

The step of processing one of the branches can comprise the step of delaying the signal of the corresponding branch by a time duration corresponding to the time duration of at least one modulation bit of the input RF signal.

The step of processing one of the branches alternatively can comprise the steps of frequency dividing, filtering and frequency multiplying the signal of the processed branch.

The dividing factor of the frequency dividing step is equal to the multiplying factor of the frequency multiplying step.

The processed signal branch can be optionally switched on and off.

According to a still further aspect of the present invention a demodulating method is provided comprising the steps of the down-converting method as set forth above. In this case the signal supply to the input port of the three port junction device is a digital modulated signal and the switching is controlled to be opened during a time duration corresponding to one half of the bit duration of the supplied signal.

The demodulating method can comprise the step of A/D converting at least one signal based on output signals of the power sensors.

The demodulating method can comprise a down-converting method as set forth above and furthermore is still a step of averaging the output of at least one of the power sensors and analog processing the output of the averaging step and signals corresponding to the input signal of the averaging step.

More than one demodulation state can be generated by the analog processing step, such that additional information is obtained indicating the quality of the demodulation. This (soft) information can be used in a decoding step.

The demodulating method can comprise the steps of A/D converting the output of the analog processing step with more than two bits, digitally processing the A/D converted signals and supplying the digitally processed signals to a soft decision unit.

Further advantages, features and objects of the present invention will now be explained with reference to a plurality of embodiments of the present invention and by referencing to the figures of the enclosed drawings.

Figure 2:
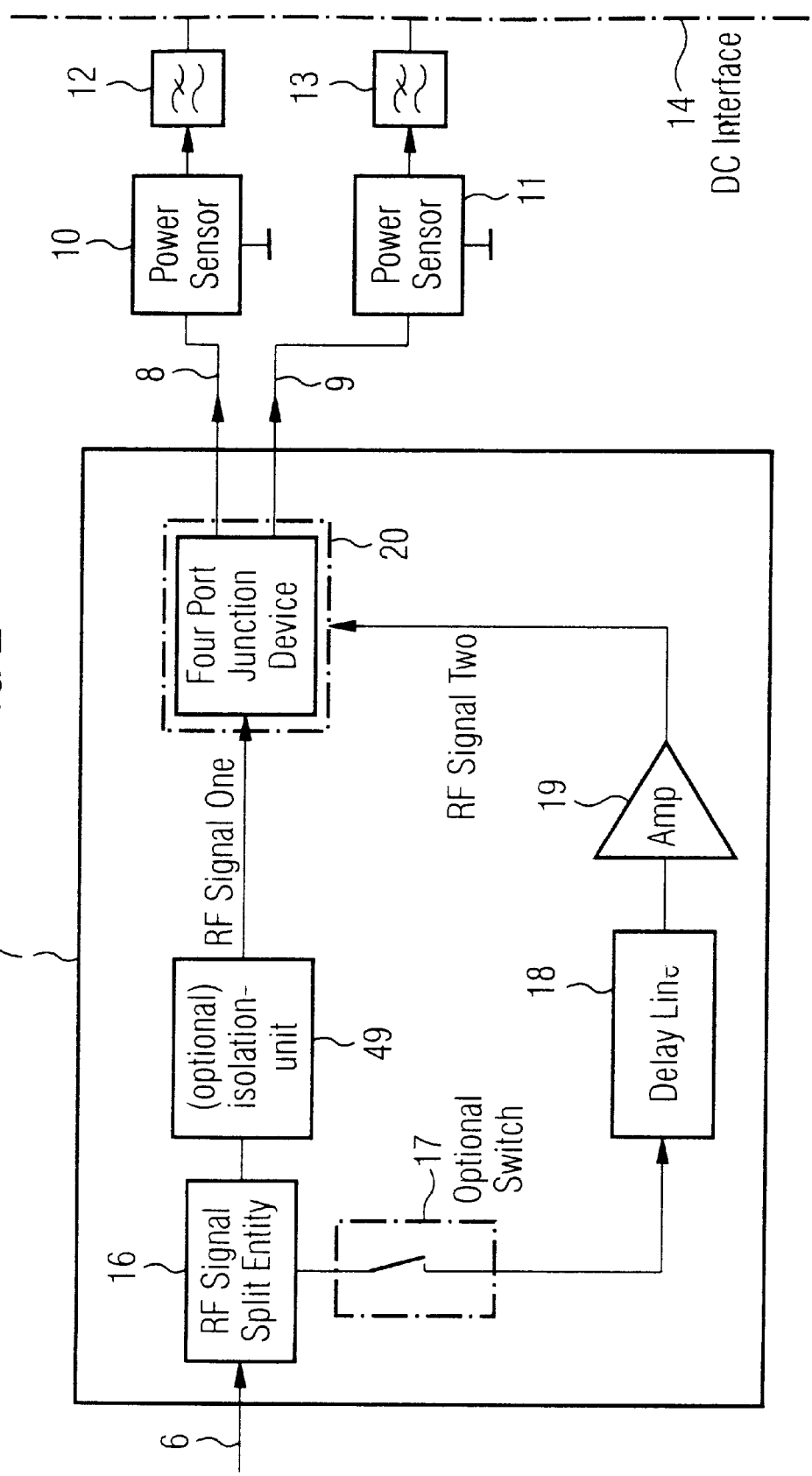
Figure 3:
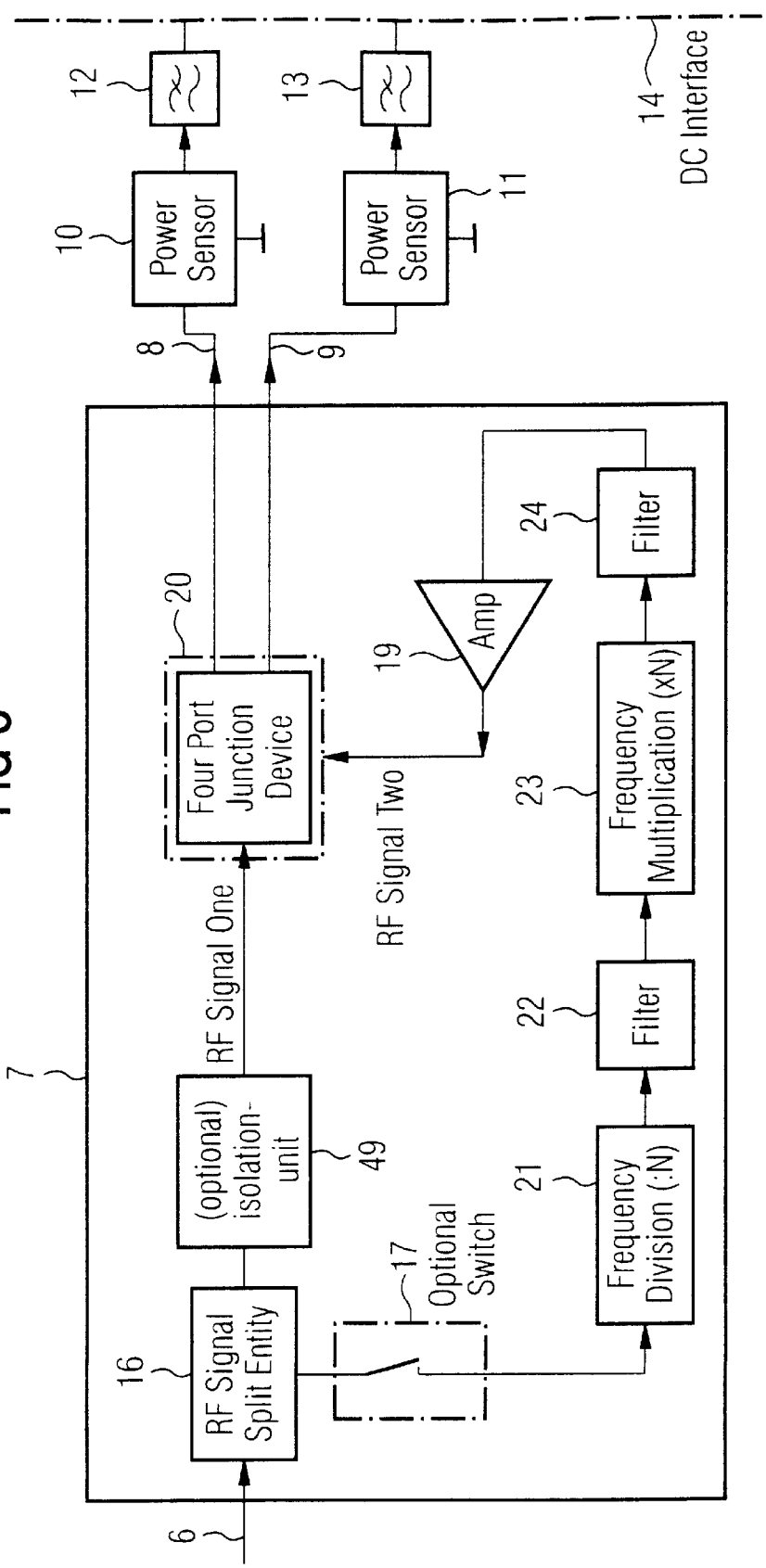
Figure 4:
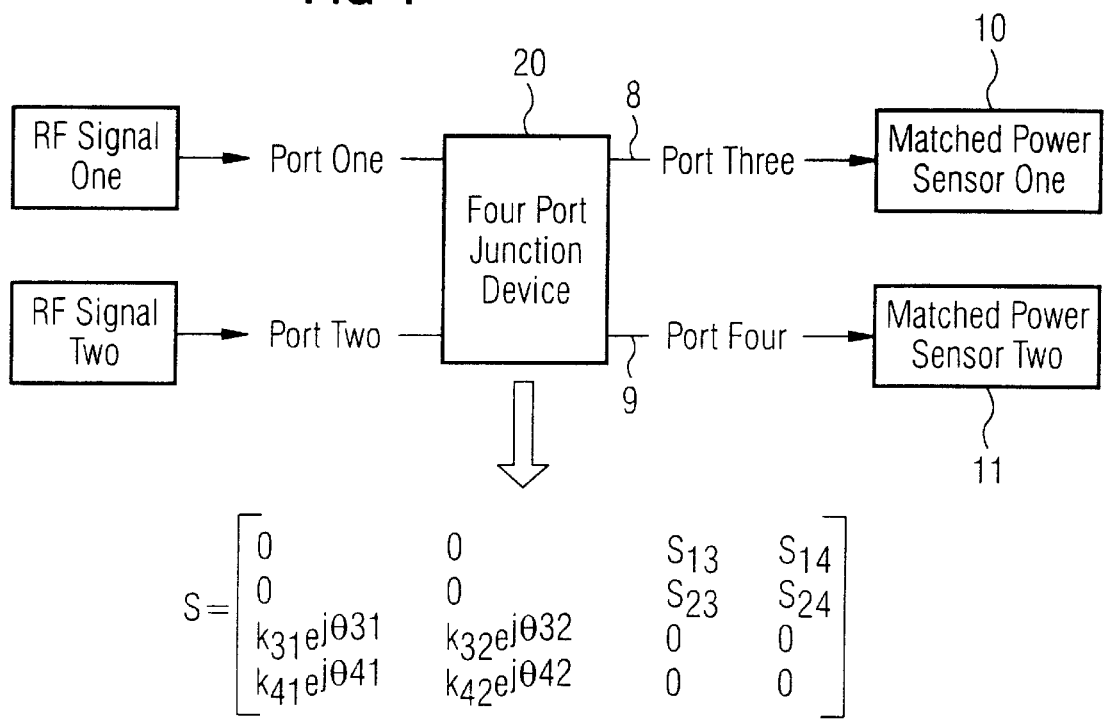
Figure 5:
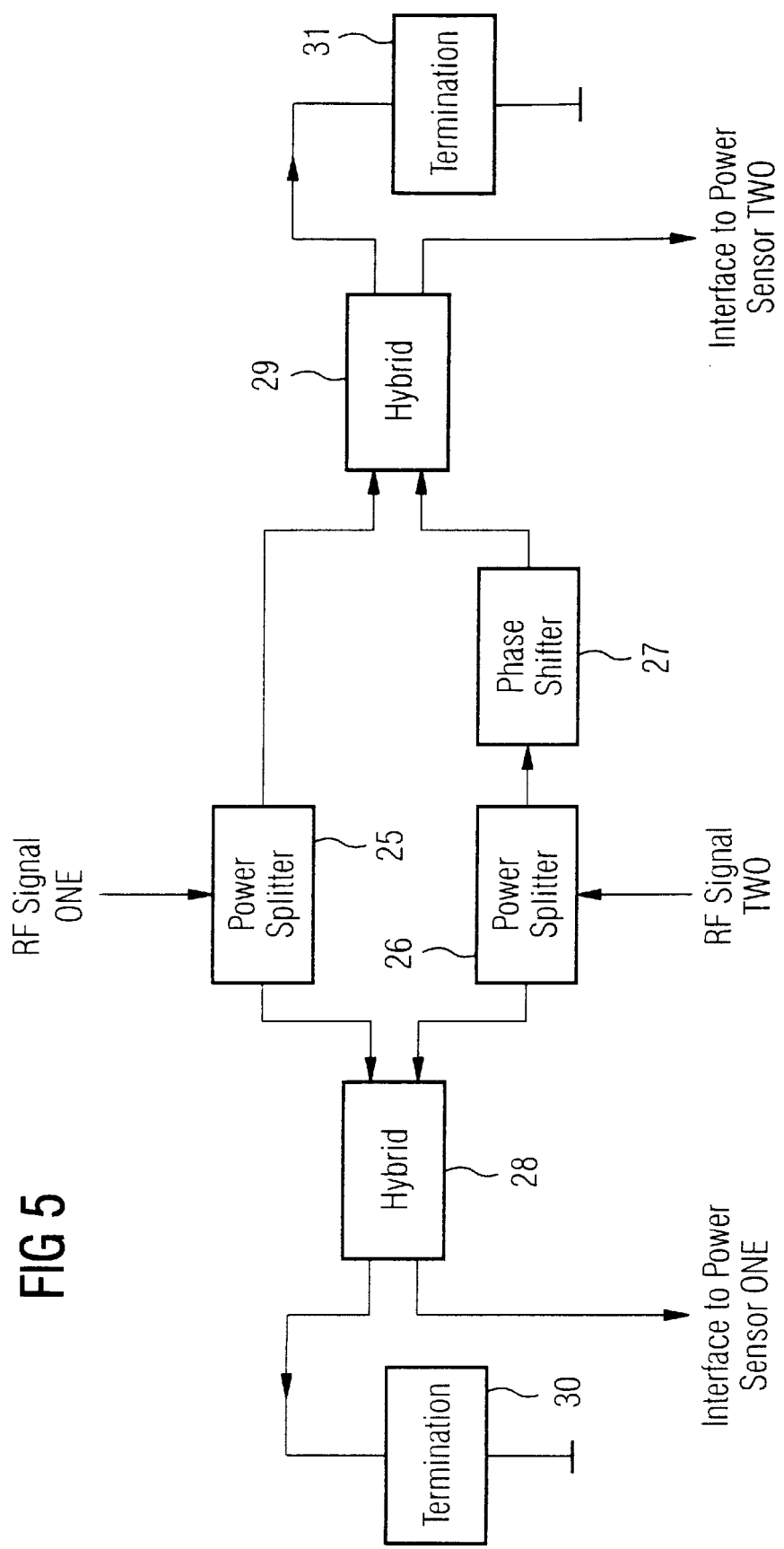
Figure 6A:
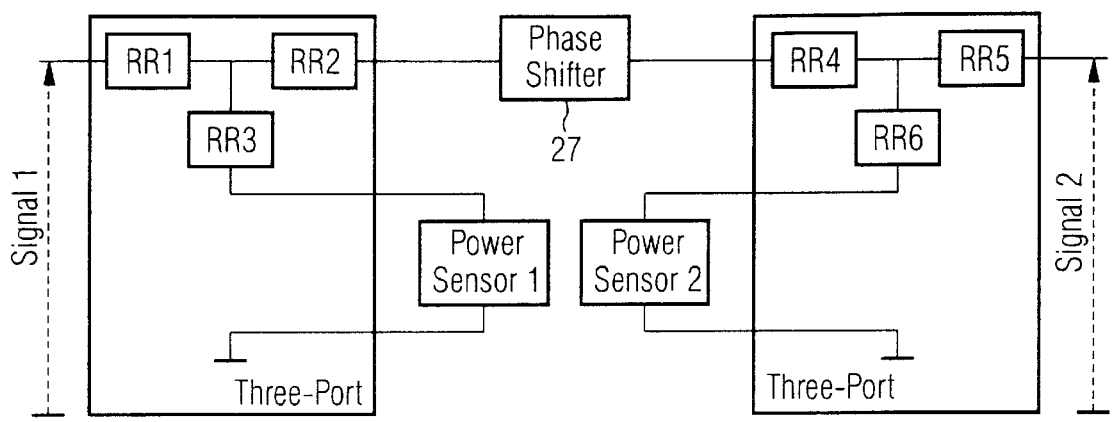
Figure 6B:
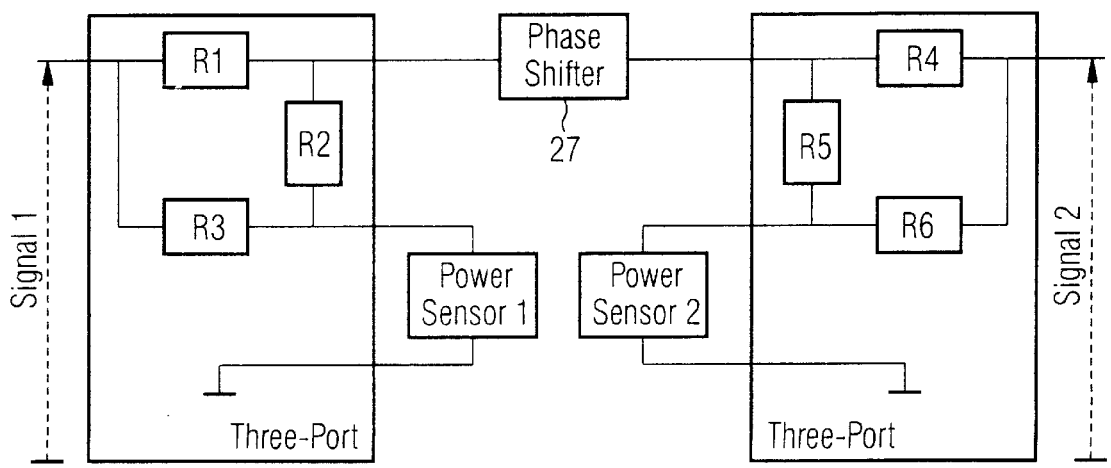
Figure 10:
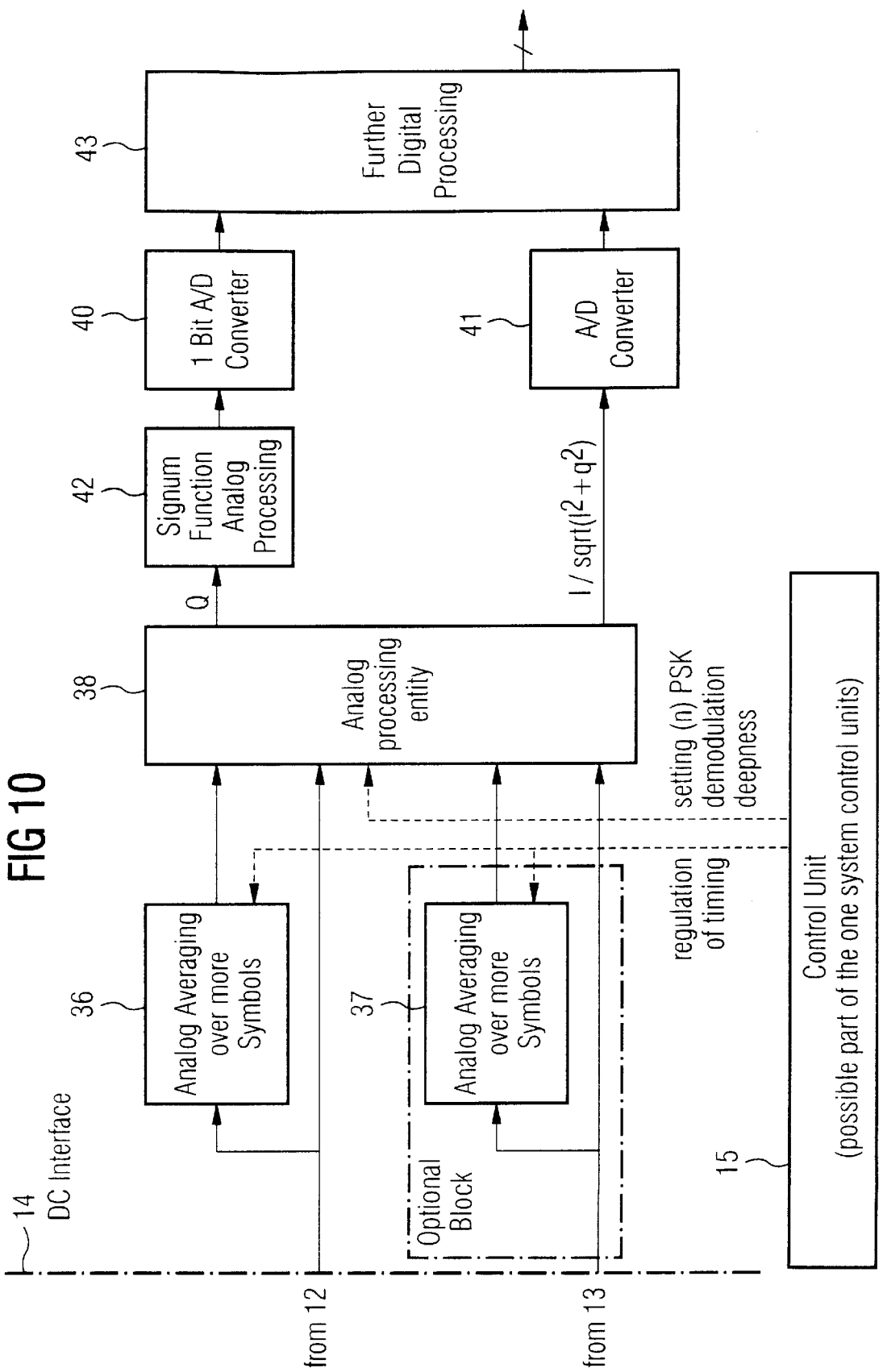
Figure 11A:
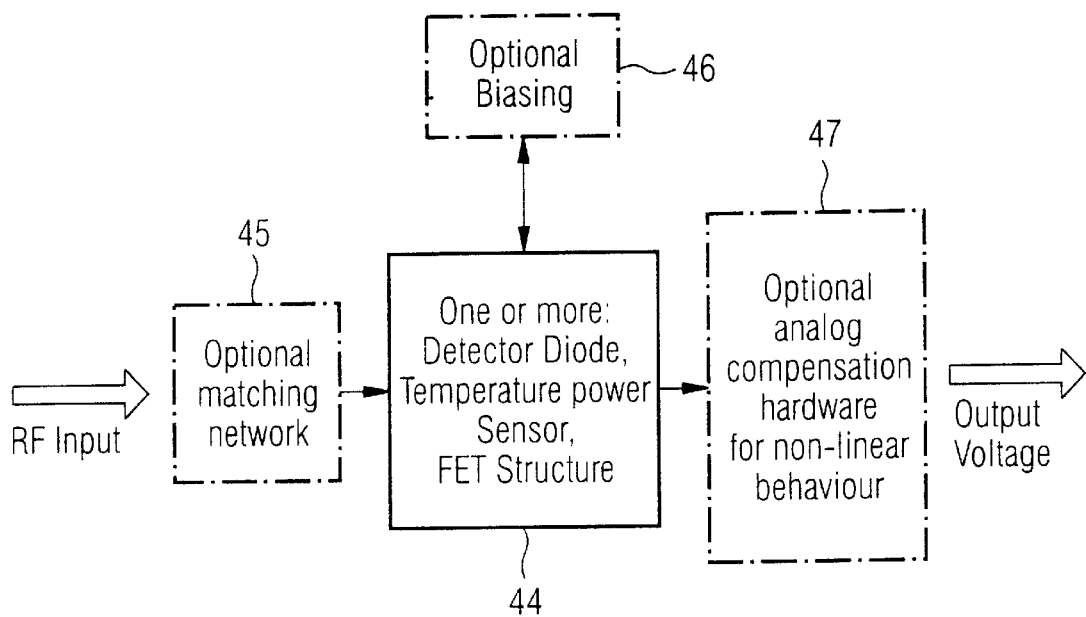
Figure 11B:
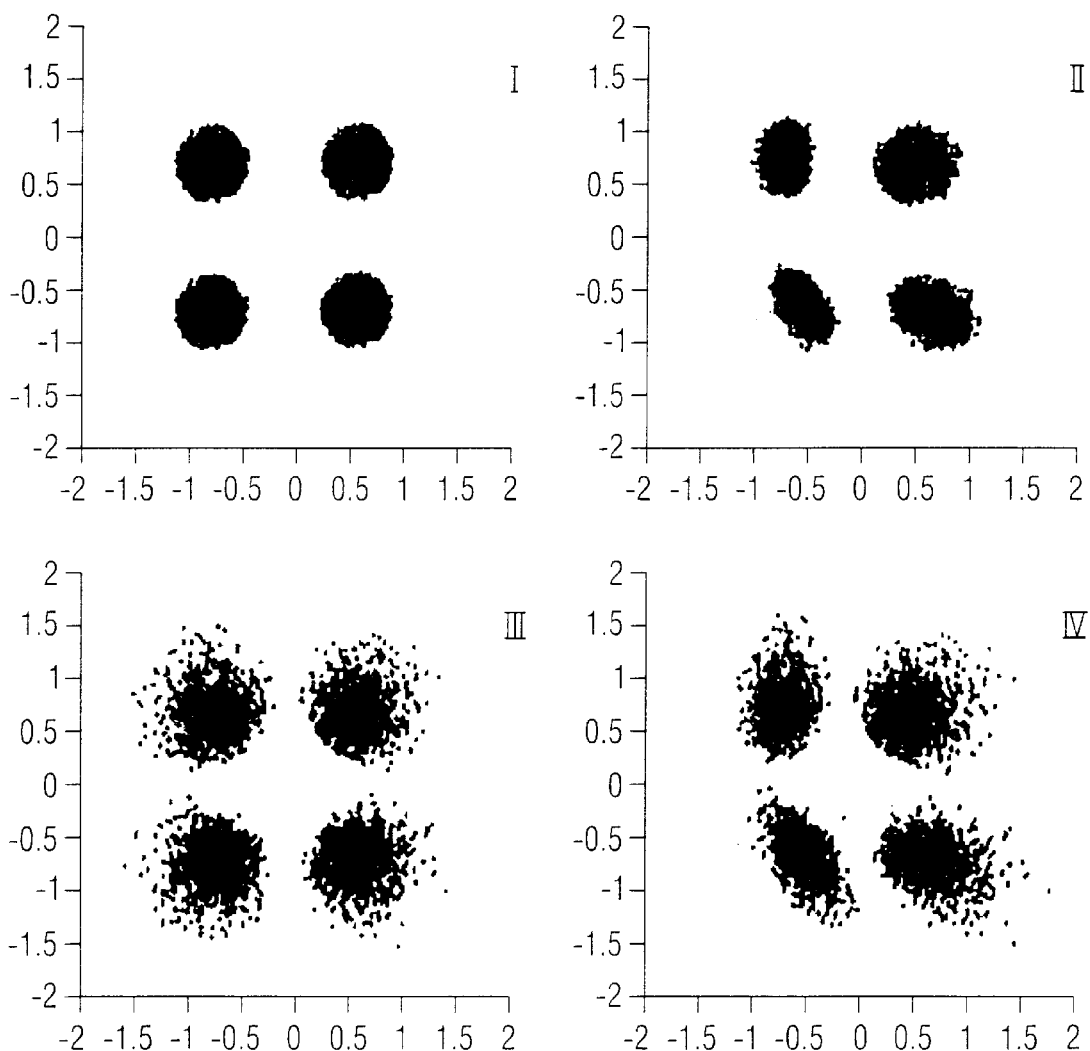
Figure 12:
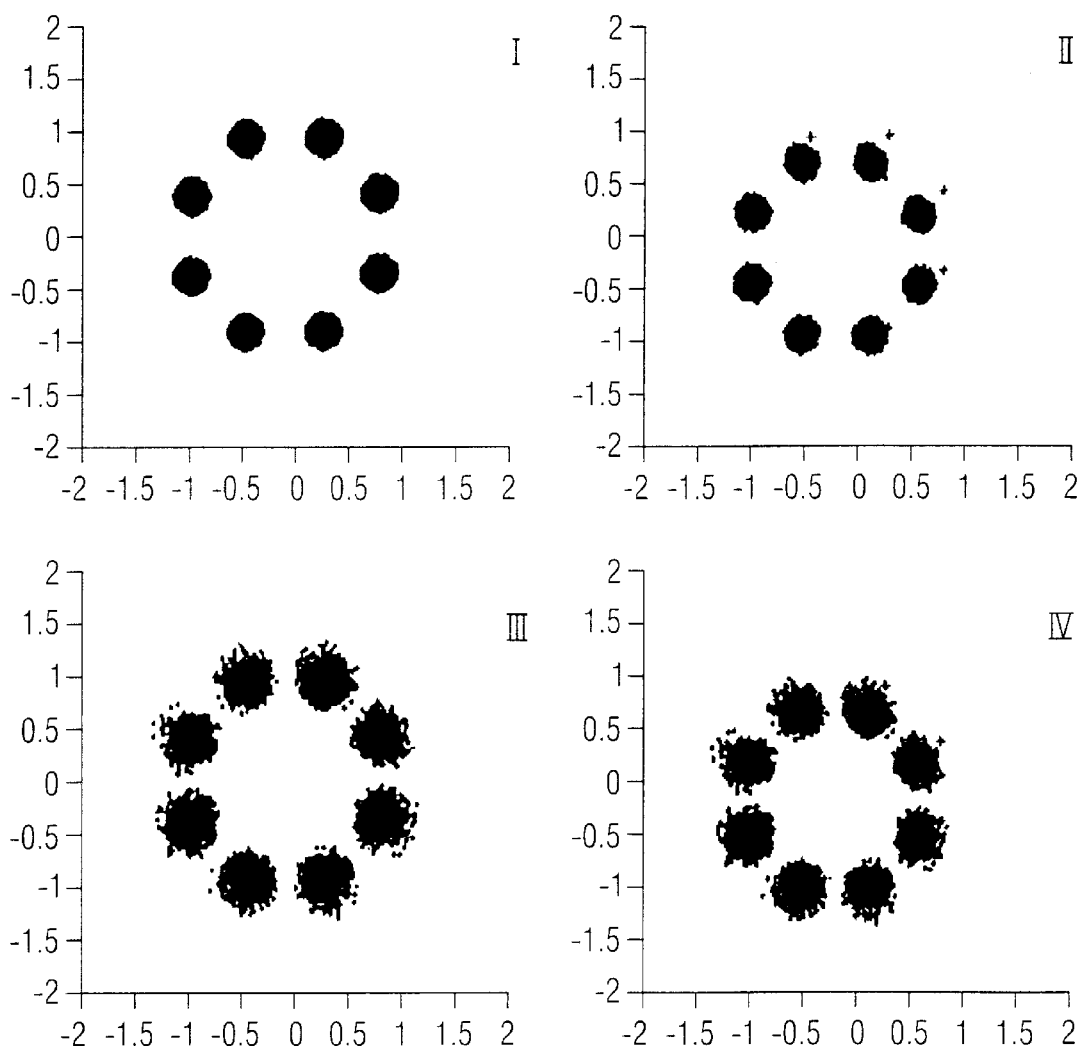
Figure 13:
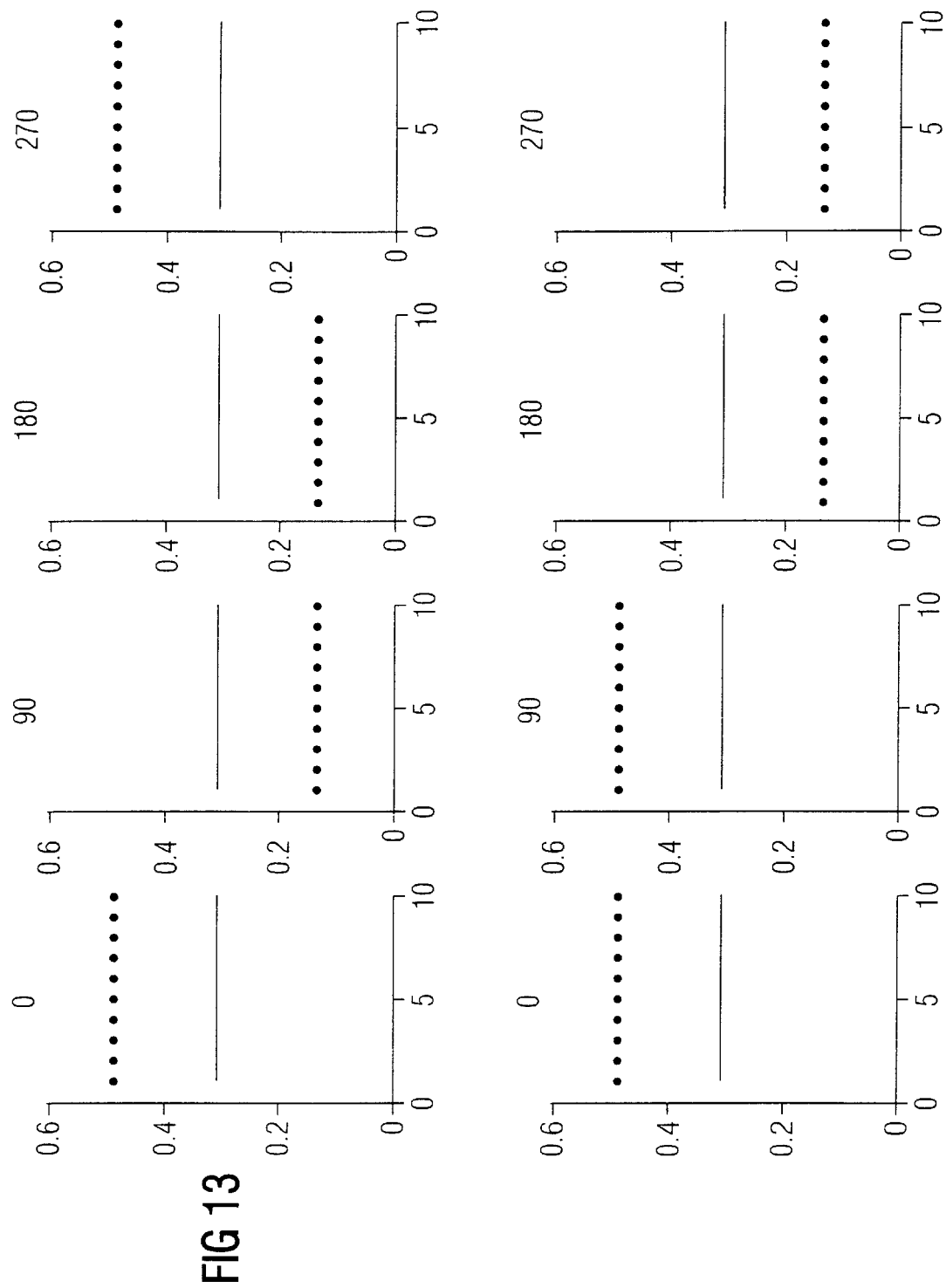
Figure 14:
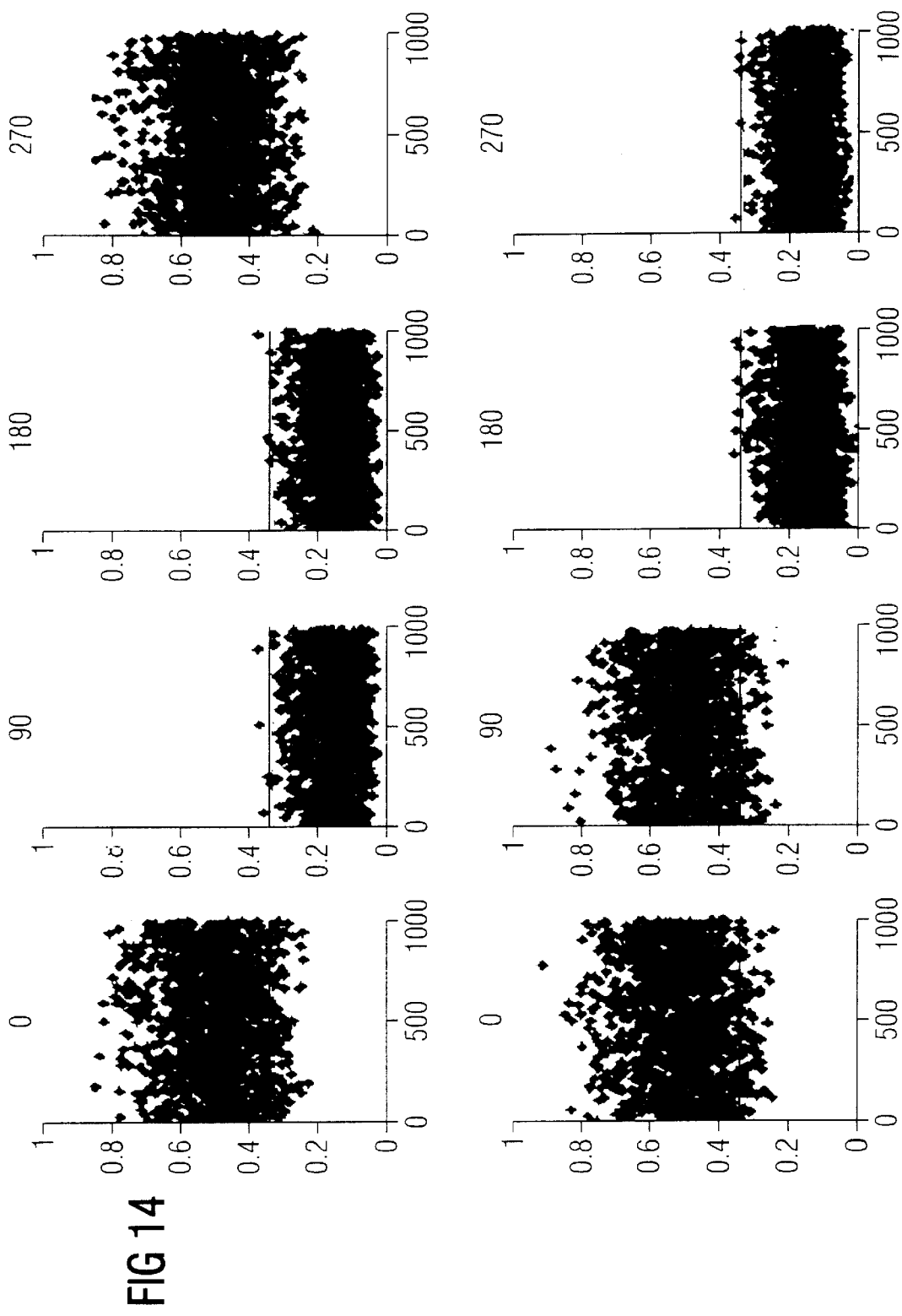
Figure 15:
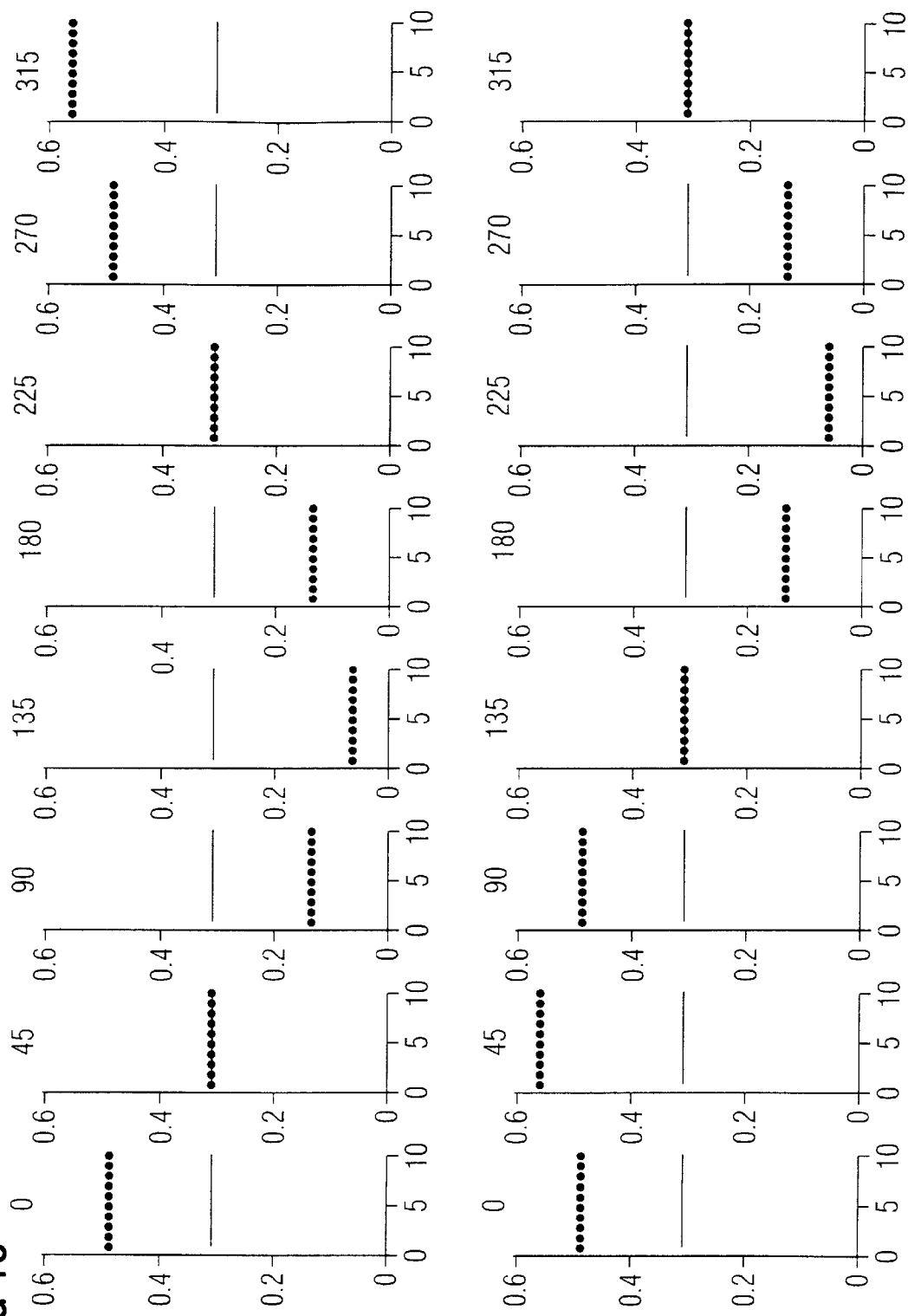
Figure 16:
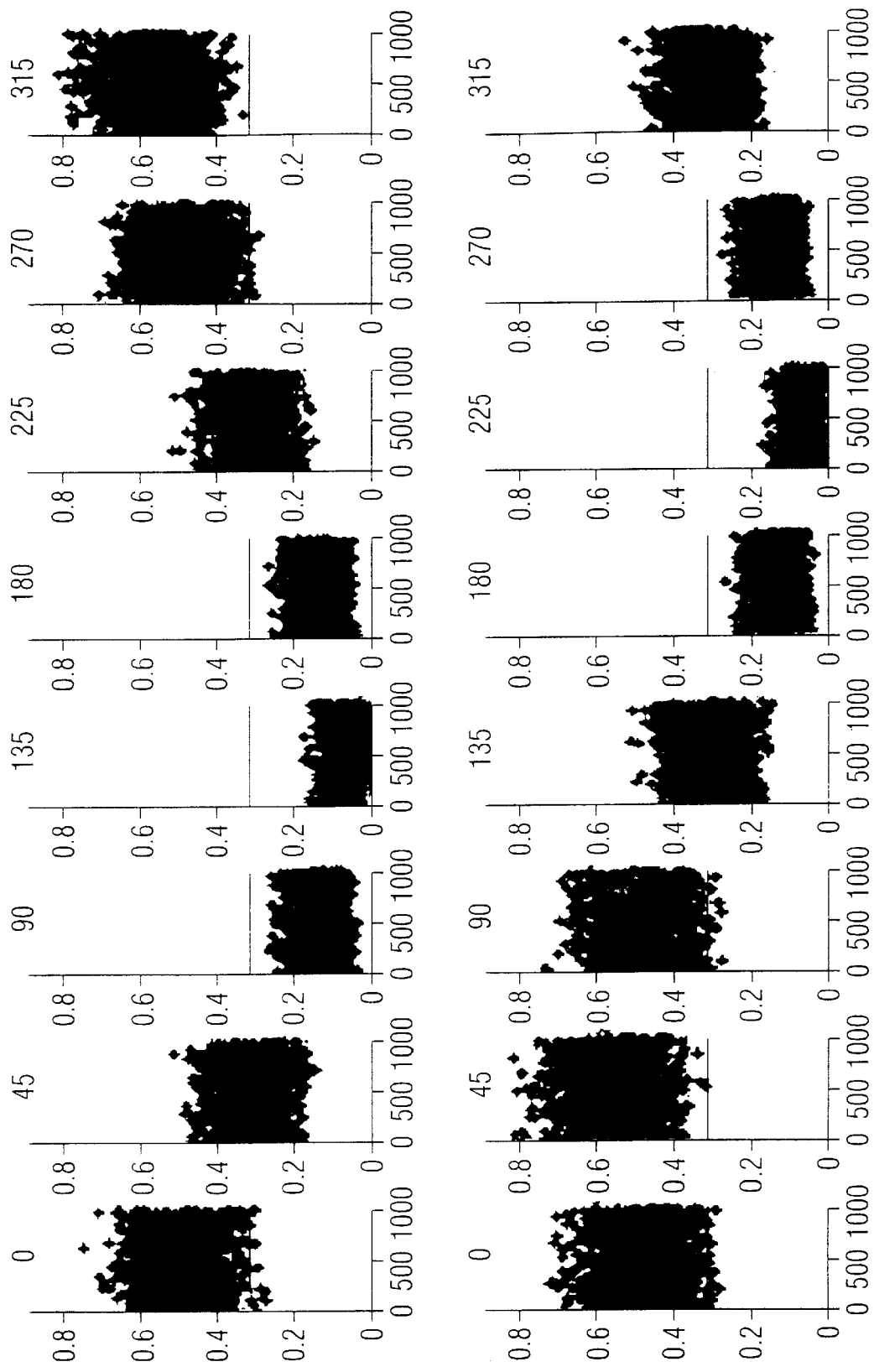

FIG. 1 shows a schematic diagram of the general structure of a down converter according to the present invention, FIG. 2 shows the internal structure of a linear three port circuitry according to the first embodiment of the present invention, FIG. 3 shows a second embodiment for the internal structure of the linear three port circuitry according to the present invention, FIG. 4 shows a functional description of am ideal four port junction device used in the linear three port circuits according to the embodiments of FIGS. 2 and 3, respectively, FIG. 5 shows a possible implementation of a four port junction device with an isolation function, FIGS. 6 a, b show further possible implementations for a four port junction device using resistive elements, FIG. 7 shows the circuitry attached to the DC interface of FIG. 1, FIG. 8 shows a further possible option for the circuitry attached to the DC interface, FIG. 9 shows a still further possible option of the circuitry attached to the DC interface, FIG. 10 shows a still further option of the circuitry attached to the DC interface of FIG. 1, FIG. 11a shows the internal structure of the power sensor bloc according to the present invention, FIG. 11b shows differential or not differential QPSK states demodulated by the down converters on the basis of FIGS. 3 and 2, respectively, with a S/N ratio of 9 dB, FIG. 12 shows differential or not differential 8 PSK states demodulated by the down converters according to FIGS. 3 and 2, respectively, in case of a S/N ratio of 15 dB, FIG. 13 shows the ideal DC output of the power sensors, FIG. 14 shows ideal DC output signals of the power sensors with a signal to a noise ratio of 9 dB, FIG. 15 shows ideal DC output signals of the power sensors without noise, FIG. 16 shows ideal DC output signals of the power sensors in the case of a signal to noise ratio of 15 dB, FIG. 17 shows ideal DC output signals of the power sensors without noise.

The present inventions is particularly applicable to direct receivers for applications where mostly one channel communication is targeted. The proposed technology is particularly suitable for demodulation and down-conversion of PSK modulation or generally phase state modulation, according to which the magnitude of the signals are constant due to the modulation process. In case of such an operation no local oscillator signal is needed. Method of the down-conversion based on the proposed technology will be described and simulations will be explained later on.

The proposed receivers using six-port technology usually utilized four power sensors. According to the central idea of the present invention only two power sensors are used without time multiplexing. Local oscillator signals are not needed.

With reference to FIG. 1 a down-converting receiver comprising a linear three port circuitry 7 will now be explained. A digital modulated RF signal is received by an antenna 1. Optionally a block 2 comprising a first stage down converter 3 can be provided. The antenna signal and the output signal of the optional block 2, respectively, are passed through a band pass filter 4 and then amplified by a low-noise amplifier 5. The gain of the LNA amplifier 5 is controlled by control unit 15 which is part of the system control unit. The output signal of the LNA 5 is input to the only one input terminal 6 of the linear three port device 7. The linear three port device 7 has two output terminals 8, 9, at which output signals generated on the basis of the signal supply to the input terminal 6 are supplied to power sensors 10, 11. The output signals of the power sensors 10, 11 are low-pass filtered 12, 13 and then supplied to a DC interface 14. The circuitry connected on the other side of the DC interface 14 will be explained later on.

As can be seen from FIG. 1, the down converter essentially consists of a passively near three port high frequency circuitry 7 having one input terminal 6 for modulated RF signals and two RF outputs 8, 9 connected to the two power sensors 10, 11.

With reference to FIGS. 2 and 3 different embodiments of the internal structure of the three port junction device 7 will now be explained.

According to the embodiment of FIG. 2 the signal supplied to the input terminal 6 of the three port junction 7 is split by a power divider 16 into a first and a second branch. The first branch (RF signal 1) is supplied directly to a four port junction device 20.

The internal structure and the functionality of a four port junction device is known from PCT/EP 98 083 29 in the name of Sony International (Europe) GmbH. As the four port junction device is explicitly explained in that application, a detailed description of a four port junction device in the frame of the present description is omitted and reference is made to the corresponding figures and parts of the description of PCT/EP 98 083 29.

The second branch generated by the power divider 16 is optionally supplied to a switch 17 or directly supplied to a delay line 18. The delay line 18 provides for a delay corresponding to the time duration of one or more modulation bits of the digital modulated RF signal supplied at the input terminal 6. The output signal of the delay line 18 is amplified 19 and supplied as RF signal 2 to the second input terminal of the four port junction device 20. The output signals supplied to the power sensor 10, 11 are generated at the output terminals of the four port junction device 20.

According to the embodiment of FIG. 2 therefore the linear three port passive circuitry 7 contains a power splitter (power divider) 16 for splitting the incoming RF signal into two branches. One branch is directly supplied to the four port junction device 20 and the second branch is processed either as shown in FIG. 2 or as shown in FIG. 3 as will be explained later on. Optionally the signal of the first branch can be passed through an isolation unit 49 before being supplied to the four port junction device 20.

According to the embodiment of FIG. 2 the second branch generated by the power splitter 16 is delayed by a duration of one (or several) modulation bits by the delay line 18. For the implementation of the RF delay line 18 several implementations are possible. After the optional amplification by the amplifier 19, which serves for a possible correction of the delay line losses and for an isolation, this signal (RF signal 2) is supplied to the four port junction device 20. It is to be noted that the amplification can take place before or after the delay line 18. The amplifier gain can be set to one, in which case the amplifier 19 purely serves as isolation unit.

Now the second embodiment for processing the second branch of the RF signal generated by the power splitter 16 will be explained. After optional being passed through the switch 17, the signal in the second branch is supplied to a frequency divider 21 having a dividing factor N. The output signal of the frequency divider 21 is passed through a filter 22 and then to a frequency multiplier 23 having a multiplying factor preferably equal to the frequency division factor N. The output signal of the frequency multiplier 23 is again passed through a filter 24, amplified by the amplifier 19 and then supplied to the second input terminal of the four port junction device 20 as RF signal 2. Again it is to be noted that the low-noise amplification by the amplifier 19 can take place in any position of the second branch. Furthermore it is to be noted that the frequency division factor and the multiplying factor can be chosen arbitrary, but preferably a factor of two is enough. Due to this processing of the RF signal in the second branch as shown in FIG. 3, the phase information contained in the signal is lost.

The optional switch can be particularly omitted in case a simple modulation technique like (n) PSK is used and the general conditions do not vary too much in time. Optionally an isolation unit 49 may be provided in the first branch between the power splitter 16 and the four port junction device 20.

Reference is now made to FIG. 4 showing a mathematical description of the ideal four port junction device 20 using the S-matrix approach. A plurality of different implementations can be used to realize the functionality described by the S-matrix of FIG. 4. FIG. 5 and FIG. 6 show two possible implementation options for a four port junction device. Note that a detailed description of the four port junction device is again omitted as four port junction devices are already explained in detail in the application PCT/EP/98/083 29 as set forth above.

As can be seen in FIG. 5, according to this implementation, a first RF signal 1 is supplied to a first power splitter 25 and a second RF signal 2 is supplied to a second power splitter 26. The power splitter 25 and the power splitter 26 are connected to a hybrid circuit 28 which is connected to earth by a termination 30 and which is furthermore connected to the interface to the power sensor 1. The second signal branches respectively generated by the power splitter 25 and the power splitter 26 are supplied to a second hybrid circuit 29, wherein the second branch signal generated by the second power splitter 26 is first phase shifted by a phase shifter 27 before being supplied to the hybrid circuit 29. The second hybrid circuit 29 again is connected to ground by a termination circuit 31 and with an interface to the power sensor 2. Note that also 90° and 180° hybrids may be used and the function of the circuitry is explained in the application PCT/EP/98/083 29.

FIG. 6 shows a further possible implementation for a four port junction device in the case that an isolation function is obtained by other external means. A detailed description of the implementation is shown in FIG. 6 can also be found in the application PCT/EP98/083 29.

In the following equations (1) to (23) a general mathematical description of the proposed down conversion method. For both cases of the FIG. 2 and FIG. 3 the applied mathematical description is similar. Mathematical presentation is shown for case of the FIG. 3, having related time delay functionality.

Table 1 shows the legend of the used variables.

$$v_1 = \rho V_0 e^{j\varphi} \tag{1}$$

$$v_2 = V_0 \tag{2}$$

$$v = \frac{v_1}{v_2} \rho e^{j\varphi} \tag{3}$$

$$I = \rho\cos\varphi \quad Q = \rho\sin\varphi$$

Equation S presents the ideal S matrix of the four port junction.

$$s = \begin{bmatrix} 0 & 0 & s_{13} & s_{14} \\ 0 & 0 & s_{23} & s_{24} \\ s_{31} & s_{32} & 0 & 0 \\ s_{41} & s_{42} & 0 & 0 \end{bmatrix} = \begin{bmatrix} 0 & 0 & s_{13} & s_{14} \\ 0 & 0 & s_{23} & s_{24} \\ k_{31}e^{j\theta_{31}} & k_{32}e^{j\theta_{32}} & 0 & 0 \\ k_{41}e^{j\theta_{41}} & k_{42}e^{j\theta_{42}} & 0 & 0 \end{bmatrix} \tag{4}$$

$$v_3 = s_{31}v_1 + s_{32}v_2 = k_{31}e^{j\theta_{31}}\rho e^{j\varphi}v_2 + k_{32}e^{j\theta_{32}}v_2 \tag{5}$$

$$v_4 = s_{41}v_1 + s_{42}v_2 = k_{41}e^{j\theta_{41}}\rho e^{j\varphi}v_2 + k_{42}e^{j\theta_{42}}v_2 \tag{6}$$

$$v_3 = (k_{31}\rho e^{j(\theta_{31}-\theta_{32}+\varphi)} + k_{32})v_2 e^{j\theta_{32}} \tag{7}$$

$$v_4 = (k_{41}\rho e^{j(\theta_{41}-\theta_{42}+\varphi)} + k_{42})v_2 e^{j\theta_{42}} \tag{8}$$

$$P_3 = P_2(k_{31}^2\rho^2 + k_{32}^2 + 2k_{31}k_{32}\rho\cos(\theta_{31}-\theta_{32}+\varphi)) \tag{9}$$

$$P_4 = P_2(k_{41}^2\rho^2 + k_{42}^2 + 2k_{41}k_{42}\rho\cos(\theta_{41}-\theta_{42}+\varphi)) \tag{10}$$

$$\overline{P}_3 = \frac{1}{N}\sum_1^N P_3 \tag{11}$$

$$P_2 = \frac{\overline{P}_3}{k_{31}^2\rho^2 + k_{32}^2} \tag{12}$$

$$X_3 = \frac{k_{31}^2\rho^2 + k_{32}^2}{2k_{31}k_{32}}\frac{P_3}{\overline{P}_3} - \frac{k_{31}^2\rho^2}{2k_{31}k_{32}} - \frac{k_{32}^2}{2k_{31}k_{32}} \tag{13}$$

$$X_4 = \frac{k_{31}^2\rho^2 + k_{32}^2}{2k_{41}k_{42}}\frac{P_4}{\overline{P}_3} - \frac{k_{41}^2\rho^2}{2k_{41}k_{42}} - \frac{k_{42}^2}{2k_{41}k_{42}} \tag{14}$$

$$\Delta\theta_3 = \theta_{31} - \theta_{32} \quad \Delta\theta_4 = \theta_{41} - \theta_{42} \tag{15}$$

$$X_3 = \rho\cos(\Delta\theta_3 + \varphi) = \rho(\cos\Delta\theta_3\cos\varphi - \sin\Delta\theta_3\sin\varphi) \tag{16}$$

$$X_4 = \rho\cos(\Delta\theta_4 + \varphi) = \rho(\cos\Delta\theta_4\cos\varphi - \sin\Delta\theta_4\sin\varphi) \tag{17}$$

$$I = \frac{X_3\sin\Delta\theta_4 - X_4\sin\Delta\theta_3}{\sin(\Delta\theta_4 - \Delta\theta_3)} \tag{18}$$

$$Q = \frac{X_3\cos\Delta\theta_4 - X_4\cos\Delta\theta_3}{\sin(\Delta\theta_4 - \Delta\theta_3)} \tag{19}$$

$$\Delta\theta_3 \neq k\frac{\pi}{2}, \quad \Delta\theta_4 \neq k\frac{\pi}{2}, \quad \Delta\theta_4 - \Delta\theta_1 \neq k\pi \tag{20}$$

$$Y_1 = \frac{1}{\rho} = \frac{X_3\sin\Delta\theta_4 - X_4\sin\Delta\theta_3}{\rho\sin(\Delta\theta_4 - \Delta\theta_3)} \tag{21}$$

$$Y_2 = sgn(Q) \tag{22}$$

$$\varphi = Y_2 \arccos(Y_1) \tag{23}$$

TABLE 1

Legend of used variables

| | |
|---|---|
| $v_1$ | RF signal to be I/Q demodulated |
| $v_2$ | Second RF signal (known) |
| $\rho$ | magnitude ratio between RF signal one and two |
| $\phi$ | phase difference between RF signal one and two |
| s | S matrix of the four port junction |
| $k_{mn}$ | magnitude of the complex transfer function from port n to m |
| $\theta_{mn}$ | phase of the complex transfer function from port n to m |
| $v_3$ | signal which approaches power sensor 1 |
| $v_4$ | signal which approaches power sensor 2 |
| $P_3$ | Power level detected at power sensor 1 |
| $P_4$ | Power level detected at power sensor 2 |
| $\overline{P}_0$ | Averaged Power level detected at power sensor 1 after N signals |
| $X_3$ | Help-function of Power $P_3$ |
| $X_4$ | Help-function of Power $P_4$ |
| $Y_1$ | Normalized I value to be converted in the digital domain |
| $Y_2$ | Sign of Q value |

The major impact is that the signals before approaching four port junction 20, (of the FIG. 2 and FIG. 3) contain two different noise portions. That also means that proposed non-coherent system has larger noise sensitivity compered to the coherent solution, but potentially simpler realisation. The advantage of the simple realisation is growing with the increase of the frequency of operation.

With reference to FIG. 1 now different implementations of circuitries connect to the DC interface 14 will be explained. As shown in FIG. 7 the DC interface 14 can be connected by means of two A/D converting means 32, 33 to a digital processing unit (DSP unit) 34 and a demodulation unit 35. The DSP unit 34 is in charge of processing the incoming digital signals either to effect an demodulation or even a full signal demodulation. Note that the control unit 15 which is part of the system control units can be designed to control the A/D converter 32, 33 as well as the digital processing unit 34.

FIGS. 8 to 10 show other implementations having two DC inputs coming from the power sensors 10, 11 after being filtered in the filters 12, 13. Furthermore according to the implementations of FIGS. 8 to 10 two DC outputs are provided which are connected to analogue processing and averaging units. Optionally an additional low-pass filtering can be applied.

Method of Operation in the case of the (n) PSK demodulation

FIGS. 8, 9 and 10 are related to the (n) PSK demodulation using the concept according to the present invention. In all three figures three different options for analog circuits realization are proposed. The whole signal information is placed in the relative phase of the modulated signals. According to this fact information about signal magnitude does not necessarily contain the information. This means that only two power sensors are enough to decode the signals, taking into account the non-coherent operation proposed.

Moreover using the method according to the present invention, the requirements of the gain control may be reduced, meaning that digital gain control may be omitted, and only simple analog rough gain control may be sufficient. The detected DC levels at the power sensors outputs are averaged in an analogue manner and supplied to the two analog processing entities 36, 37 (FIGS. 8 and 9). Averaging is done over more symbols. Timing information comes from the control unit 15. The averaged values on both power sensors 10, 11 determine thresholds, which are used for analog comparison and hard decision, according to the following equation.

Taking into account the embodiments of FIGS. 2 to 6 it is obvious that the transfer functions (from RF signal inputs to the related power sensors) of the four port junction 20 are also known, as well as related phase shift. That means that thresholds for nPSK can be calculated, having only information of the average power. Thresholds for QPSK are straight forward. Information about thresholds is further provided to the analog circuitry 38 giving hard-decision (n) PSK demodulated values (FIG. 8). By the usage of the analog circuitry 38 it is possible to perform hard decision demodulation, which has additional information, which may be useful for channel decoding entity. Namely, if the signal/ noise ratio decreases, there might occur the case that the hard decision block 38 denotes more than one demodulation states. This may be also understand as some art of the additional "quasi soft bit"0 information.

In FIG. 9 instead of the single "Analog circuitry block" two 2–4 bits A/D converters 40, 41 are provided giving "quasi soft bits. The term "Quasi" means that obtained bits have to be further DSP processed before provided to a decoding unit, which support soft bits operation. That also means that this part of the digital processing may be incorporated by ASICs directly, at the input of the decoding entity.

Method and apparatus of operation in the case of the phase demodulation, where magnitudes of signal are constant The devices required for this operation are described at the FIG. 10, which are attached to the structures of the FIG. 2 or FIG. 3, and it can be named phase demodulator. At the DC interface 14, at (at least one) power sensor, an analog unit 36, 37 for signal averaging is attached connected to the analog circuitry 38 which is defined according to the above equations. The result of the analog processing are normalized I values and signum function of the Q value, which are provided to the two A/D converters 40, 41, where one of them is one bit converter at it is attached to the signum function unit 42.

After obtaining cosine value of the phase difference and signum value, after digitizing, further digital processing 43 may be performed to calculate the actual values of the phase information.

FIG. 11a show the internal structure of a power sensor 10, 11. The central part of the power sensor is a detector diode, a temperature power sensor and a FET structure 44. Furthermore an optional matching network 45, an optional biasing unit 46 and an optional analog compensation hardware for non-linear behaviour 47 is connected to the central unit 44. Note that a detailed description of the function and the internal structure of a power sensor can be found in PCT/EP98/083 29.

With reference to FIGS. 11d to 17 now simulation results will be explained. This simulation has been performed to verify the proposed technology and particularly to verify the proposed technique under the following simulation conditions:

the power sensors are detector diodes which are working in the linear region and have an input impedance with the same tolerances (reactive part considered as matched) as the discrete resistors in the assembly, the three port junction is realized by the resistive elements as shown in FIG. 6 taking into account the general topology of FIG. 3. The delay process is considered as being ideal, and the resistor absolute values are considered having tolerances of 0% and 15%

FIG. 11b show differential and non-differential QPSK states demodulated by the structures of FIGS. 3 and 2, respectively, with a signal/noise ratio of 9 dB.

I shows QPSK signals with a noise margin in case of an ideal four port junction and a demodulation with an external local oscillator signal, II shows as a comparison to the present invention, QPSK signals with a noise margin for a real four port structure, wherein absolute resistor tolerances of 20% are included and a local oscillator is applied, III shows QPSK signals with a noise margin for an ideal four port junction according to the present invention as shown in FIGS. 2 and 3, and IV shows QPSK signals with a noise margin with a real four port structure according to the present invention, wherein resistor tolerances of 20% are included.

FIG. 12 shows differential or non-differential 8 PSK states demodulated by the structures of FIG. 3 and FIG. 2, respectively, with a signal/noise ratio of 15 dB.

I shows 8 PSK signals with a noise margin for an ideal four port junction and a demodulation with an external LO signal (as a comparison to the present invention).

II shows SPSK signals with a noise margin with a real four port structure of FIG. 3, wherein absolute resistor tolerances of 20% are included.

III shows 8 PSK signals with a noise margin with an ideal four port junction according to the present invention as shown in FIG. 2 and FIG. 3, and IV shows 8 PSK signals with a noise margin that the real four port structure according to the present invention, wherein absolute resistor tolerances of 20% are assumed.

Note that the cases III and IV according to the present invention respectively show a lower performance in comparison to the cases I and II, but this is more than compensated by the simpler design as a local oscillator is no longer necessary.

FIG. 13 shows ideal DC output signals of the power sensors without noise and with an ideal four port circuitry, wherein the output signals are depicted as a function of the phase difference of the incoming signals at the input ports of the four port junction of FIG. 2 and FIG. 3. The solid lines show an average value and docket lines show the related states. It is assumed that the phase shifter of FIG. 6 has a shifting value of 45°.

FIG. 14 shows an ideal DC output of the power sensors with a signal/noise ratio of 9 dB and with an ideal four port circuitry. The ideal DC outputs are depicted as a function of the phase difference of the incoming QPSK signals at the input ports of the four port junction of FIG. 2 and FIG. 3. The solid lines show the average value and docket lines show the related states. It is again assumed that the phase shifter of FIG. 6 has a shifting value of 45°.

FIG. 15 shows ideal DC output signals of the power sensors without noise and with an ideal four port circuitry. The ideal DC output has a function of the phase difference of the incoming 8 PSK signals at the input ports of the four port junction of FIGS. 2 and 3. The solid lines show average values and the docket lines show the related states. It is assumed that the phase shifter FIG. 6 has a shifting value of 45°.

FIG. 16 shows ideal DC output signals of the power sensors with a signal/noise ratio of 15 dB and to an ideal four port circuitry. The ideal DC output signals are shown as a function of the phase difference of the incoming 8 PSK signals at the input ports of the four port junction of FIGS. 2 and 3. The solid line shows the average value and docket lines show the related states. Again it is assumed that the phase shifter provides for a shifting of 45°.

FIG. 17 shows the ideal DC output signals of the power sensors without noise and with an ideal four port circuitry, wherein the output is shown as a function of the phase difference of the incoming 8 PSK signals at the input ports of the four port junction of the FIGS. 2 and 3. The solid lines show an average value and the docket line show the related states. It is assumed that the phase shifter of FIG. 6 provides for a phase shifting value of 75°. Note that the thresholds are changing with the change of the phase shift in comparison to FIG. 15 for example. If the device is designed to work at a frequency f-index 0 it may also work at a frequency f-index=1 f-index 0×75/45=f-index 0×1.66 (Note the phase shifter is usually linearly dependent of the applied frequency). However, as can be seen from FIG. 17, the thresholds are closer so that the system would require a better signal/noise ratio if it is used for broadband applications.

The present invention proposes a three port technology which allows the same functionality as known six port receiver topologies but with significantly reduced RF circuitry, having only two power sensors and no need for a local oscillator (non-coherent detection). In case of simple modulation procedures like PSK no RFs which is needed. The proposed technology addresses cases where only one channel low-range communication is targeted. This is quite practical for application where higher microwave and lower millimeter-wave range is used and where full frequency re-use of the one channel may be proposed. This is particularly convenient for simple modulation schemes like nPSK. The proposed concept is particularly advantageous for low-cost device applications. The proposed solution is furthermore very advantageous for typical applications in the millimeter-wave range. Furthermore it is advantageous for one channel communication with a simple modulation scheme like QPSK. This might be particularly interesting for 60 Ghz or 24 Ghz (ISM band) applications.

What is claimed is:

1. Down converter for RF signals, comprising:
   one three port junction having one input port for receiving RF signals and two output ports, the three port junction comprising:
      a power splitter for dividing the signal supplied to the input terminal into two branches;
      processing means for processing one of the branches;
      a switch provided in the signal branch processed by the processing means; and
      a four port junction device for combining the two branches and for generating two output signals to be supplied to the output ports; and
   a plurality of power sensors, each having one of the output ports respectively connected thereto.

2. Down converter according to claim 1, wherein the processing means comprise a delay unit.

3. Down converter according to claim 1, wherein the processing means comprise:
   a frequency divider,
   at least one filter, and
   a frequency multiplier.

4. Down converter according to claim 1, wherein an isolation unit is provided in at least one of the branches.

5. A demodulator, comprising:
   a down converter according to claim 1, wherein the signal supplied to the input port is a digital modulated RF signal and the switch is controlled to be open during a time duration corresponding to one half of the bit duration of the supplied signal.

6. Demodulator according to claim 5, further comprising low pass filters connected to the output terminals of the power sensors.

7. Demodulator according to claim 6, further comprising one A/D converter being respectively connected directly or indirectly with each of the power sensors.

8. Demodulator according to claim 6, further comprising at least one averaging unit connected to the output of each low pass filter, the output of the at least one averaging unit being supplied together with the output of low pass filter to at least one analog processing unit.

9. Demodulator according to claim 8, wherein the output of the at least one analog processing unit is supplied to an A/D converter.

10. Mobile communication device, comprising a demodulator according to claim 5.

11. Method for down converting RF signals by means of one three port junction, comprising the steps of:
   supplying an RF signal to one input port of the three port junction,
   generating two DC output signals on the basis of the one input RF signal by
      dividing the signal supplied to the input terminal into two branches,
      processing one of the branches,
      switching the signal processed branch, and
      combining the two branches and generating the two output signals, and
   supplying each of the output signals at the two output ports of the three port junction respectively to a power sensor.

12. Method for down converting RF signals according to claim 11, wherein the step of processing one of the branches further comprises the step of delaying the signal of the corresponding branch by a time duration corresponding to the time duration of at least one modulation bit of the input RF signal.

13. Method for down converting RF signals according to claim 11, wherein the step of processing one of the branches further comprises the steps of:
   frequency dividing,
   filtering, and
   a frequency multiplying the signal of the processed branch.

14. Method according to claim 11, wherein an isolation function is provided in at least one of the branches.

15. Demodulating method, comprising all of the steps of the down converting method according to claim 11, wherein the signal supplied to the input port is a digital modulated signal and the switching is controlled to be open during a time duration corresponding to one half of the bit duration of the supplied signal.

16. Demodulating method according to claim 15, further comprising the step of low pass filtering the output of the power sensors.

17. Demodulating method according to claim 16, further comprising the step of averaging the output of the at least one outputs of the filter step and analog processing the output of the averaging step together with the output of the filter step.

18. Demodulating method according to claim 17, wherein more than one demodulation state is generated by the analog processing step, such that additional hard information is obtained indicating that the state has not been detected properly.

19. Demodulating method according to claim 17, further comprising the steps of:
   A/D converting the outputs of the analog processing step,
   digitally processing the A/D converted signals, and
   supplying the digitally processed signals to a decoding step.

20. Demodulating method according to claim 19, wherein one of the A/D conversion steps is a one-bit conversion.

21. Demodulation method according to claim 15, further comprising the step of A/D converting at least one signal based on output signals of the power sensors.

* * * * *